(12) United States Patent
Ahlgren

(10) Patent No.: US 7,964,295 B2
(45) Date of Patent: Jun. 21, 2011

(54) COATED CUTTING INSERTS

(75) Inventor: Mats Ahlgren, Täby (SE)

(73) Assignee: Sandvik Intellectual Property AB, Sandviken (SE)

( * ) Notice: Subject to any disclaimer, the term of this patent is extended or adjusted under 35 U.S.C. 154(b) by 254 days.

(21) Appl. No.: 11/311,628

(22) Filed: Dec. 20, 2005

(65) Prior Publication Data

US 2006/0154051 A1    Jul. 13, 2006

(30) Foreign Application Priority Data

Dec. 22, 2004    (SE) ..................................... 0403175

(51) Int. Cl.
*B32B 9/00*    (2006.01)

(52) U.S. Cl. ............ 428/698; 51/307; 51/309; 428/336; 428/697; 428/699

(58) Field of Classification Search .................. 428/336, 428/216, 698, 699, 408, 446, 697, 472; 51/307, 51/309
See application file for complete search history.

(56) References Cited

U.S. PATENT DOCUMENTS

| | | | |
|---|---|---|---|
| 5,685,672 | A | 11/1997 | Tjernström |
| 5,700,569 | A | 12/1997 | Ruppi |
| 5,885,666 | A | 3/1999 | Doll et al. |
| 6,245,435 | B1 * | 6/2001 | O'Brien et al. ............... 428/472 |
| 6,284,356 | B1 * | 9/2001 | Kiriyama ..................... 428/216 |
| 6,309,738 | B1 | 10/2001 | Sakurai |
| 6,379,798 | B1 * | 4/2002 | Yazaki ........................ 428/698 |
| 6,426,137 | B1 | 7/2002 | Oshika et al. |
| 6,619,891 | B2 | 9/2003 | Hansson et al. |
| 6,881,475 | B2 * | 4/2005 | Ohtani et al. ................. 428/698 |
| 6,922,266 | B2 | 7/2005 | Hiramatsu |
| 6,929,432 | B2 | 8/2005 | Roman et al. |
| 6,942,935 | B2 * | 9/2005 | Ge ............................... 428/698 |
| 6,962,751 | B2 * | 11/2005 | Fukui et al. ................... 428/408 |
| 2004/0224159 | A1 | 11/2004 | Oshika et al. |
| 2006/0154109 | A1 * | 7/2006 | Ahlgren ........................ 428/698 |
| 2007/0275264 | A1 * | 11/2007 | Hultin et al. ................... 428/687 |

FOREIGN PATENT DOCUMENTS

| | | |
|---|---|---|
| EP | 1094132 B1 | 10/1999 |
| EP | 1 152 066 | 11/2001 |
| EP | 0980917 B1 | 7/2002 |
| EP | 1 266 879 | 12/2002 |
| EP | 1 266 979 | 12/2002 |
| EP | 1640089 A1 | 6/2004 |
| GB | 1 389 140 | 6/1973 |
| GB | 2 048 960 | 12/1980 |
| JP | 08-267306 | 10/1996 |
| JP | 2001-341005 | 12/2001 |
| JP | 2003-191107 | 7/2003 |
| JP | 2004-299023 | 10/2004 |
| SE | 357 772 | 7/1973 |
| SE | 357772 | 7/1973 |
| SE | 0403175-3 | 7/2005 |
| WO | 2005/085499 A1 | 9/2005 |

OTHER PUBLICATIONS

Huang et al., "Deposition of (Ti,Al)N films on A2 tool steel by reative r.f. magnetron sputtering", *Surface and Coatings Technology*, vol. 71, No. 3, Apr. 1995, pp. 259-266.
"EFI—Color Measurement Solutions: Color Glossary", http://www.efi.com/products/color_glossary.html, Oct. 31, 2005, pp. 1-9.
"Lab color space—Wikipedia, the free encyclopedia", http://en.wikipedia.org/wiki/Lab_color_space, Feb. 19, 2005, pp. 1 and 2.
Nakamoto et al., "Development of Colored Stainless Steel Sheets by Ceramics Coating", *ISIJ International*, vol. 33, No. 9, 1993, pp. 968-975.

* cited by examiner

*Primary Examiner* — Archene Turner
(74) *Attorney, Agent, or Firm* — Drinker Biddle & Reath LLP

(57) ABSTRACT

The present invention relates to a cutting insert comprising a body of sintered cemented carbide, cermet or ceramic or high speed steel or the superhard materials such as cubic boron nitride or diamond said body being provided with a hard and wear resistant coating including a thin outermost coloring non-oxide layer whereby said color is created by thin film interference.

13 Claims, No Drawings

COATED CUTTING INSERTS

BACKGROUND OF THE INVENTION

The present invention relates to tool holders for chip removing machining provided with an outermost thin film interference color layer.

The present invention relates to coated cutting tool inserts provided with an outermost thin film interference color layer. As used herein, the term "insert" refers also to solid carbide drills, end mills and the like.

Cemented carbide cutting tool inserts coated with various types of hard coatings have been commercially available for years. Such coatings are generally built up by several hard layers like TiC, Ti(C,N), TiN and $Al_2O_3$ in a multilayer structure. The sequence and the thickness of the individual layers are carefully chosen to suit different cutting applications and work-piece materials. Such coatings are most frequently deposited by using Chemical Vapor Deposition (CVD), Moderate Temperature Chemical Vapor Deposition (MTCVD) or Physical Vapor Deposition (PVD) techniques. In some rare cases also Plasma Assisted Chemical Vapor Deposition (PACVD) has been used.

The CVD technique employed for coating inserts is conducted at a rather high temperature, about 900-1000° C. Due to this high deposition temperature and to a mismatch in thermal expansion coefficient between the deposited coating materials and the cemented carbide insert, CVD produces coatings with cooling cracks and tensile stresses. With the CVD-technique it is possible to deposit many hard and wear resistant coating materials like $Al_2O_3$, TiC, Ti(C,N), TiN, Ti(C,N,O) and $ZrO_2$. The microstructure and thereby the properties of these coatings can be altered quite considerably by varying the deposition conditions.

The PVD technique runs at a significantly lower temperature about 450-700° C. and it is performed under ion bombardment leading to high compressive stresses in the coating and no cooling cracks. Because of these process differences, CVD-coated inserts are more brittle and thereby possess a lower toughness behavior compared to PVD coated inserts. PVD-coatings are generally used when sharp edges are desired.

Although these coatings have excellent technological properties, they often unfortunately have a dull and somewhat unattractive appearance. For that reason, often a thin decorative layer of TiN is deposited as the outermost layer giving the insert an attractive golden color. It would, of course, be very interesting if inserts could be given different colors as a guide to the end user to select the correct grade for a certain machining operation and not only for decorative reasons. Unfortunately, the number of colored compounds suitable for such purpose is limited. It is also important that said coloring layer does not negatively influence the properties of the inserts. The coloring layer should also be possible to deposit without introducing further unwanted compounds into the reactor. For drills and end mills, its also important that the they easily can be recoated after regrinding with a new functional wear resistant layer without prior decoating. It is also important that the colors obtained are consistent both within a charge and between charges.

GB 1389140 discloses color coding of sintered hard metal cutting inserts by coating the inserts with a layer of TiC and at least one outer layer of TiN and/or TiCN which is no thicker than 3 µm. The coatings are formed by chemical vapor deposition.

U.S. Pat. No. 5,700,569 discloses an alumina coated cemented carbide insert having improved properties for metal cutting applications. Varying the number of alumina layers changes the color of the coated insert from green at 15 layers to blue at 32 layers.

JP-A-2001-341005 discloses a insert coated with a TiCN-layer with a color defined in terms of its chromaticity a* being greater than 0 but less than 10 (red direction), b* being greater than 0 but less than 20 (yellow direction) and a brightness of L* being greater than 0 but less than 100. The a*, b* and L* coordinates are well-known in the art as part of the CIELab system, a uniform device independent color space in which colors are located within a three-dimensional rectangular coordinate system. The three dimensions are lightness (L), redness/greenness (a) and yellowness/blueness (b).

OBJECT AND SUMMARY OF THE INVENTION

It is an object of the present invention to provide a cutting insert with different colors as a guide to the end user to select the correct grade for a certain machining operation.

It is a further object of the present invention to provide a cutting insert with a coloring layer that does not negatively influence its technological performance.

It is a still further object of the present invention to provide a cutting insert with a coloring layer that easily can be deposited.

It is still another object of the present invention to provide a coated drill or end mill with a coloring layer that can be easily recoated after regrinding without prior decoating.

It is yet another object of the present invention to provide a cutting insert with a color that is consistent within a charge as well as between charges.

In accordance with the invention, there is provided a cutting insert comprising a body of cemented carbide, cermet, ceramics, high speed steel, tool steel or the superhard materials and with a hard and wear resistant coating including a thin outermost coloring non-oxide layer wherein said color is created by thin film interference.

DETAILED DESCRIPTION OF THE PREFERRED EMBODIMENTS OF THE INVENTION

According to the present invention, a cutting body is colored by an outermost thin transparent non-oxide layer, preferably a carbide, nitride or carbonitride layer of a metal from the group comprising Groups IV, V or VI of the periodic table, Al, Si and B or mixtures thereof, preferably Ti and/or Al. Its thickness is such that it is colored by interference, i.e., a thickness of about less than 0.5 µm, preferably from about 0.05 to about 0.3 µm, most preferably from about 0.05 to about less than 0.2 µm. The body comprises a sintered cemented carbide, cermet, ceramic or high speed steel or superhard materials such as cubic boron nitride or diamond. The body is in the shape of an insert, a drill, an endmill, replaceable tip etc.

The said color layer is on top of a wear resistant functional coating. Preferably said color layer is in contact with a TiN-layer, with a thickness of from about 0.1 to about 5.0 µm.

The color layer may also be the only layer.

In a preferred embodiment, the color layer is (Ti,Al)N, more specifically $Ti_xAl_{1-x}N$ with x being greater than about 0.1 but less than about 0.9, preferably greater than about 0.4 but less than about 0.7, most preferably greater than about 0.4 but less than about 0.6.

Preferably, said color layer is blue with a* being greater than about −20 but less than about 0, b* being greater than about −40 but less than about 0 and L* being greater than about 0 but less than about 95. In one preferred embodiment, a* being greater than about −20 but less than about −10. In another preferred embodiment, b* being greater than about −40 but less than about −20.

In yet a preferred embodiment, said insert is a solid carbide drill or solid carbide end-mill.

The layers are deposited by PVD-technique, preferably by magnetron sputtering or cathodic arc evaporation. Said layers are easily deposited in a production scale equipment in situ with the same set-up as used for the functional wear resistant layers.

Said color layers can also be deposited with PACVD.

The invention is additionally illustrated in connection with the following examples, which are to be considered as illustrative of the present invention. It should be understood, however, that the invention is not limited to the specific details of the examples.

EXAMPLE 1

Solid carbide drills were provided with a blue outer coating by a sputtering process. A foil 20×20 mm² large in the shape of a cylinder was coated at the same time. Both the drills and the foil were subject to the same 3-fold rotation. Ar, Kr, and $N_2$ flow were regulated to 150, 85, and 70 sccm respectively. A negative substrate bias of 100 V was applied. First a TiN layer of about 0.2 µm was deposited. On top of this TiN-layer a $(Ti_{0.5}Al_{0.5})N$ layer was deposited using two $Ti_{0.5}Al_{0.5}$-targets as metal sources. By depositing the $(Ti_{0.5}Al_{0.5})N$ layer for 23 minutes with a cathode power of 3.2 kW on each $Ti_{0.5}Al_{0.5}$-target a nice blue color was obtained. The L*, a* and b* values were measured on the foil using a Minolta Spectrophotometer CM-2500D with the following settings:

| | |
|---|---|
| Mask/Gloss | M/SCI |
| UV Setting | UV 100% |
| Illuminant1 | D65 |
| Observer | 10° |
| Display | DIFF & ABS. |

The following results were obtained: a*=−16, b*=−30 and L*=39.

EXAMPLE 2

Example 1 was repeated but by depositing (Ti,Al)N for 23 minutes with a cathode power of 3.7 kW on each $Ti_{0.5}Al_{0.5}$-target. A blue color was obtained with the following results: a*=−18, b*=−23 and L*=46.

EXAMPLE 3

Example 1 was repeated but by depositing (Ti,Al)N for 23 minutes with a cathode power of 5.7 kW on each $Ti_{0.5}Al_{0.5}$-target. A green color was obtained with the following results: a*=−14, b*=−7 and L*=56.

EXAMPLE 4

Example 1 was repeated but Ar, Kr, and $N_2$ flows were changed to 250, 150 and 70 sccm respectively and depositing (Ti,Al)N for 23 minutes with a cathode power of 3.2 kW on each $Ti_{0.5}Al_{0.5}$-target. A deep blue color was obtained with the following results: a*=−3, b*=−39 and L*=29.

EXAMPLE 5

Example 4 was repeated in its entirety after some time. Again a deep blue color was obtained with the following results: a*=−5, b*=−37 and L*=31.

EXAMPLE 6

A solid carbide drill coated with an inner 4 µm thick wear resistant TiN+(Ti,Al)N-multilayer was coated with a blue color layer according to Example 1. This drill was compared to a drill without the color layer in a cutting test in SS2541 with the following cutting data:
 Vc=100 m/min
 Feed=0.15 mm/rev
 Hole depth=20 mm (blind holes)
 Coolant=Yes

| Sample | Tool life |
|---|---|
| Standard drill | 1200 holes |
| Standard drill + blue outerlayer | 1300 holes |

EXAMPLE 7

The cutting edges of the drills used in Example 6 were re-ground. After that the drills were re-coated with 4 µm (Ti, Al)N and tested in the same cutting test as described in Example 6.

| Sample | Tool life |
|---|---|
| Re-coated standard drill | 1100 holes |
| Re-coated blue drill | 1000 holes |

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

The invention claimed is:

1. Cutting insert comprising a body and a hard and wear resistant coating including a thin outermost coloring non-oxide layer wherein said color is created by thin film interference, wherein said layer is $Ti_xAl_{1-x}N$ and wherein x is greater than about 0.1 but less than about 0.9, and wherein said coloring layer has a thickness of about 0.05 µm to about 0.3 µm, wherein said coloring layer has a value of color coefficients of: a* greater than about −20 but less than or equal to about −3, b* greater than about −40 but less than about 0, and L* greater than about 0 but less than about 95.

2. A cutting insert of claim 1 wherein said coloring layer has a thickness of about 0.05 µm to less than about 0.2 µm.

3. A cutting insert of claim 1 wherein said coloring layer is blue.

4. A cutting insert of claim 1 wherein said layer is deposited on top of a TiN-layer.

5. A cutting insert of claim 4 wherein the TiN layer is from about 0.1 to about 5 µm thick.

6. A cutting insert of claim 1 wherein said insert is a solid carbide drill or solid carbide end-mill.

7. A cutting insert of claim 1 wherein x is greater than about 0.4 but less than about 0.7.

8. A cutting insert of claim 7 wherein x is greater than about 0.4 but less than about 0.6.

9. A cutting insert of claim 8, wherein said coloring layer has a thickness of about 0.05 μm.

10. A cutting insert of claim 1 wherein the body is formed from a cemented carbide, a cermet, or a ceramic.

11. A cutting insert of claim 1, wherein the body is formed from a tool steel.

12. A cutting insert of claim 11, wherein the tool steel is a high speed steel.

13. A cutting insert of claim 1, wherein the body includes cubic boron nitride or diamond.

* * * * *